United States Patent [19]

Gallagher et al.

[11] 4,414,649

[45] Nov. 8, 1983

[54] GAP TOLERANT MERGE ELEMENT FOR CONTIGUOUS-DISK BUBBLE DEVICES

[75] Inventors: Timothy J. Gallagher, Mountain View; Kochan Ju, San Jose, both of Calif.

[73] Assignee: International Business Machines Corporation, Armonk, N.Y.

[21] Appl. No.: 351,814

[22] Filed: Feb. 24, 1982

[51] Int. Cl.³ ............................................. G11C 19/08
[52] U.S. Cl. ....................................................... 365/36
[58] Field of Search ................................... 365/36, 41

[56] References Cited

U.S. PATENT DOCUMENTS 4,276,614  6/1981  Nelson et al. .......................... 365/36

OTHER PUBLICATIONS

Journal of Applied Physics—vol. 52, No. 3; Mar. 1981 pp. 2380-2382.
"Design of Bubble Device Elements Employing Ion-Implanted Propagation Patterns" by T. J. Nelson et al., Bell System Technical Journal vol. 5, pp. 229-257 (Feb. 1980).

Primary Examiner—James W. Moffitt
Attorney, Agent, or Firm—Joseph E. Kieninger

[57] ABSTRACT

A gap tolerant merge element insensitive to crystallographic orientation has a first input track with an end portion substantially facing the end portion of a second input track to form a merge region. The straight edge region in the end portion of the first input track is of a different length than the straight edge region in the end portion of the second input track that it faces.

5 Claims, 3 Drawing Figures

U.S. Patent Nov. 8, 1983 4,414,649
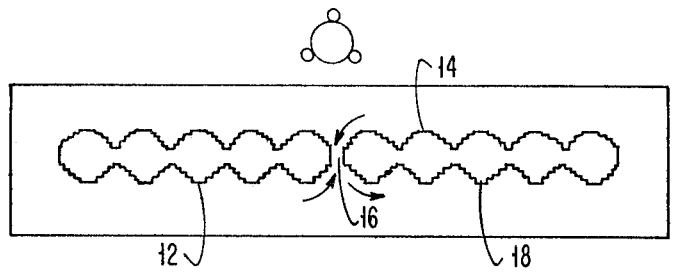
PRIOR ART FIG. 1
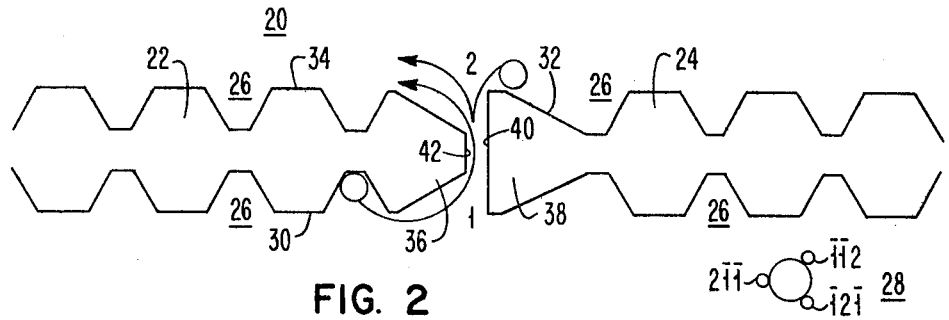
FIG. 2
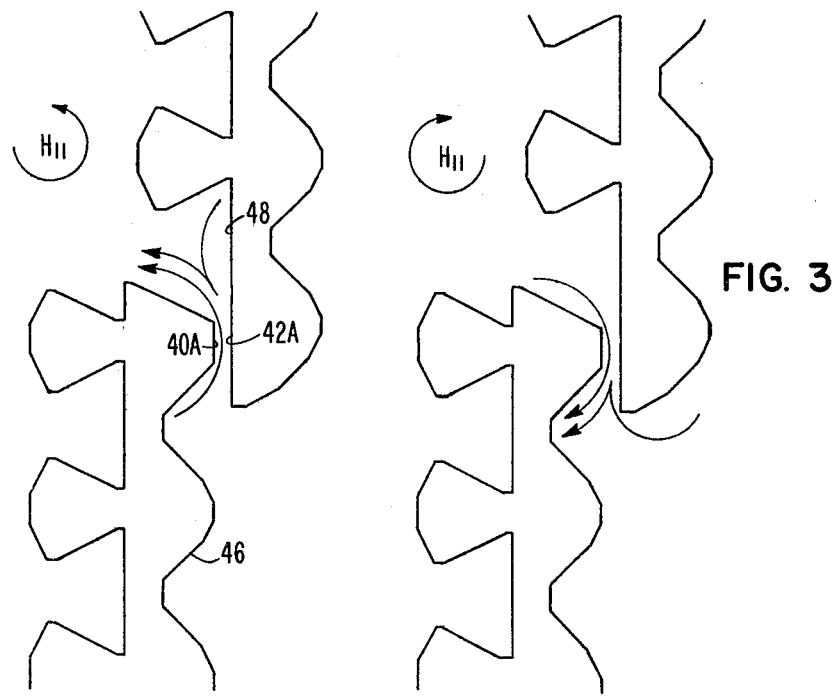
FIG. 3

GAP TOLERANT MERGE ELEMENT FOR CONTIGUOUS-DISK BUBBLE DEVICES

DESCRIPTION

1. Technical Field

This invention relates to ion-implanted contiguous-disk bubble devices and more particularly to a gap tolerant merge element.

2. Background Art

A merge gate in an ion-implanted contiguous-disk bubble device may be used to combine two bubble data streams into a single common stream. For example, a merge gate may be positioned on a track leading to the detector thereby permitting one detector to sense bubbles either from the storage loops or directly from the generator.

A merge gate for ion-implanted contiguous-disk bubble devices has been described by Nelson et al in the Bell System Technical Journal Vol. 59, pages 229-257 (February 1980) and in U.S. Pat. No. 4,276,614 as shown in FIG. 1. When subjected to a counterclockwise in-plane rotational field, the bubbles propagate along the very good propagation input track 12 and the very poor propagation input track 14 to merge region 16 and then along very good propagation output track 18. This merge gate relies on a tip-to-tip relationship between the two input paths. This merge gate does not have a large gap tolerance, that is, the width of the gap must be close to the diameter of the bubble in order to have a bias field range of 10% or higher. In addition, this merge gate is sensitive to the crystallographic orientation. If the crystallographic orientation is rotated 90°, the device no longer acts as a merge element because bubbles may pass through the elements in either direction.

Another merge element for an ion-implanted contiguous-disk bubble devices is described in copending application, Ser. No. 287,337 filed July 27, 1981 and assigned to the assignee of the present invention. This merge element includes one input track with a tip portion substantially facing the cusp portion of a second input track to form a merge region. An output track is associated with the merge region. In a preferred embodiment, the merge element is passive and does not have a conductor. In another embodiment, the merge element is active and does have a conductor.

SUMMARY OF THE INVENTION

It is a primary object of this invention to provide an improved merge element for contiguous-disk bubble devices.

It is another object of this invention to provide a gap tolerant merge element.

It is still another object of this invention to provide a merge element that is insensitive to the crystallographic orientation.

These and other objects are accomplished with a gap tolerant merge element which includes one input track with an end portion substantially facing the end portion of a second input track to form a merge region. The straight edge region in the end portion of the first input track is of a different length than the straight edge region in the end portion of the second input track that it faces. In one embodiment the straight end region is perpendicular to the direction that the bubbles are propagated on the first input track. In a second embodiment the straight end region is parallel to the direction that the bubbles are propagated on the first input track. This gap tolerant merge element permits the gap to be more than twice the diameter of the bubble and still provide a 10% bias field range. This merge element is also insensitive to the crystallographic orientation.

Other objects of this invention will be apparent from the following detailed description, reference being made to the accompanying drawing wherein the specific embodiment of the invention is shown.

BRIEF DESCRIPTION OF THE DRAWINGS

FIG. 1 is a top view of a prior art merge element;

FIG. 2 is a top view of one embodiment of a merge element in accordance with this invention; and FIG. 3 is a top view of a second embodiment of a merge element in accordance with this invention.

DESCRIPTION OF THE PREFERRED EMBODIMENT

As shown in FIG. 2, a merge element 20 contains two non-implanted regions 22 and 24 surrounded by an ion-implanted region 26 in the bubble domain supporting material (not shown) having the crystallographic orientation 28. The crystallographic orientation 28 results in both input tracks 30 and 32 and output track portion 34 being good propagation tracks in contrast to the combination of one very good input track 12, one very poor input track 14 and one very good output track 18 as shown in prior art FIG. 1. The input track 30 has an end portion 36 substantially facing the end portion 38 of input track 32 to form a merge region. The end portion 36 has a straight edge region 40 that connects input track 30 to output track 34. The length of straight edge region 40 is a given length. The end portion 38 has a straight edge region 42 that is parallel to straight edge region 40. The length of straight edge region 42 is longer than straight edge region 40.

It is necessary that the length of the two straight edge regions 40 and 42 be of different lengths in order to provide the merge function. When the straight edges are of different lengths, the region between edges 40 and 42 is a unidirectional path for the propagation of bubbles. If the straight edge regions 40 and 42 were of the same length, then the region between the straight edges would permit a bidirectional propagation of bubbles similar to FIG. 1.

If the sense of rotation is reversed, the direction of propagations through the merge region is also reversed, that is, the bubbles would leave the merge region and propagate along track 30 away from the merge region.

EXAMPLE 1

A test of the type of merge element shown in FIG. 2 was done on a single layer bubble film. The testing was performed with a 50 Oe 400 kHz drive field, with start/stop operation. A 11% bias field margin has been obtained on the merge element having a straight edge region 42 length of three microns and a channel width between regions 40 and 42 of two microns. At the low end of the margin, the bubbles do not enter the merge region between the straight edge regions 40 and 42. At the upper end of the margin the bubbles collapse as they enter the merge region, a result of the reduced edge affinity in the merge region due to the opening of the merge region. The mid bias of this merge element is very close to that of the 18 square micron minor loops of the same sample.

The data in Example 1 demonstrates that the merge function can be achieved solely through the use of the device geometry shown in FIG. 2 and does not utilize the effects of crystallographic orientation which was required for the proper operation of the device shown in FIG. 1. However, the device in FIG. 2 can also be oriented to take advantage of the crystallographic orientation effect.

Another merge gate design is shown in FIG. 3. With this design, the straight edge regions 40A and 42A are parallel to the direction of the input propagation tracks 46 and 48. In general, this type of merge gate should also work with other orientations.

Although a preferred embodiment of this invention has been described, it is understood that numerous variations may be made in accordance with the principles of this invention.

What is claimed is:

1. A merge element for ion-implanted contiguous-disk bubble devices comprising
    a first bubble propagation track having a first end portion, said first portion having a first straight edge region with a first length, and
    a second bubble propagation track having a second end portion, said second portion having a second straight edge region with a second length, said second length longer than said first length, said second region facing said first region to form the opposite sides of a merge channel, said first end portion and said second end portion form angles with respect to a line passing through the center of said merge channel which are asymmetric to each other and which participate in the merge function wherein said merge channel allows only unidirectional bubble propagation therethrough.

2. A merge element as described in claim 1 wherein said first edge region is perpendicular to the directions that the bubbles are propagated on said first propagation track.

3. A merge element as described in claim 2 wherein said second edge region is perpendicular to the directions that the bubbles are propagated on said second propagation track.

4. A merge element as described in claim 1 wherein said first edge region is parallel to the directions that the bubbles are propagated on said first propagation track.

5. A merge element as described in claim 4 wherein said second edge region is parallel to the directions that the bubbles are propagated on said second propagation track.

* * * * *